US010502782B2

United States Patent
Kravets et al.

(10) Patent No.: US 10,502,782 B2
(45) Date of Patent: Dec. 10, 2019

(54) SYNTHESIS FOR RANDOM TESTABILITY USING UNREACHABLE STATES IN INTEGRATED CIRCUITS

(71) Applicant: International Business Machines Corporation, Armonk, NY (US)

(72) Inventors: Victor N. Kravets, White Plains, NY (US); Haoxing Ren, Austin, TX (US); Mary P. Kusko, Hopewell Junction, NY (US); Spencer K. Millican, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 15/809,315

(22) Filed: Nov. 10, 2017

(65) Prior Publication Data
US 2019/0146031 A1 May 16, 2019

(51) Int. Cl.
G06F 11/22 (2006.01)
G06F 17/50 (2006.01)
G01R 31/3177 (2006.01)

(52) U.S. Cl.
CPC ..... G01R 31/3177 (2013.01); G06F 17/5045 (2013.01); G06F 2217/14 (2013.01)

(58) Field of Classification Search
USPC ................. 716/104, 106, 111, 112, 132, 136; 714/733, 738
See application file for complete search history.

(56) References Cited

U.S. PATENT DOCUMENTS 5,617,531 A * 4/1997 Crouch ................ G11C 29/006
714/10
5,625,630 A 4/1997 Abramovici et al.
(Continued)

FOREIGN PATENT DOCUMENTS

JP 6110964 A2 4/1994

OTHER PUBLICATIONS

Yotsuyanagi et al., "Undetectable Fault Removal of Sequential Circuits Based on Unreachable States", Department of Applied Physics, Faculty of Engineering, Osaka University, Book, DOI: 10.1109/VTEST.1998.670866, 1998, pp. 176-181.
(Continued)

*Primary Examiner* — Brian Ngo
(74) *Attorney, Agent, or Firm* — Scully, Soctt, Murphy & Presser, P.C.; David Zwick, Esq.

(57) ABSTRACT

A system and method for using unreachable states of a circuit design in a testing mode to increase random testability of a random resistant logic circuit. Control-improving logic circuitry is integrated into a logic circuit design to improve its testability and will not affect behavior of the design in its functional mode (by remaining "inactive" in the functional mode of the integrated circuit). The control-improving logic circuitry is automatically activated in testing mode. The control improving logic circuit is generated selectively for random resistant logic circuit regions that exhibit limited controllability in the functional mode and improves controllability of random resistant logic in the testing mode. The improved controllability results from activating test circuitry in the states that are not reachable during normal functionality. The utilization of unreachable states of a design renders unnecessary use of an explicit test enable signal, and provides for more compact implementation of test circuitry.

20 Claims, 9 Drawing Sheets

(56) References Cited

U.S. PATENT DOCUMENTS

| | | | |
|---|---|---|---|
| 5,680,332 | A | 10/1997 | Raimi et al. |
| 6,389,586 | B1 | 5/2002 | McElvain |
| 6,463,560 | B1* | 10/2002 | Bhawmik .......... G01R 31/3187 714/733 |
| 6,662,327 | B1* | 12/2003 | Rajski .............. G01R 31/31813 714/738 |
| 6,782,515 | B2 | 8/2004 | Scott et al. |
| 6,885,983 | B1 | 4/2005 | Ho et al. |
| 6,957,403 | B2* | 10/2005 | Wang .............. G01R 31/31704 703/16 |
| 7,216,318 | B1 | 5/2007 | Siarkowski |
| 7,260,799 | B2 | 8/2007 | Baumgartner et al. |
| 7,281,225 | B2 | 10/2007 | Jain et al. |
| 8,181,134 | B2 | 5/2012 | Baumgartner et al. |
| 2003/0149927 | A1* | 8/2003 | Wang .................... G06F 11/263 714/738 |
| 2004/0199887 | A1 | 10/2004 | Jain et al. |
| 2005/0138474 | A1 | 6/2005 | Jain et al. |
| 2006/0190873 | A1 | 8/2006 | Baumgartner et al. |
| 2010/0057820 | A1* | 3/2010 | Matsumoto ............ G06F 7/588 708/250 |
| 2010/0179784 | A1* | 7/2010 | Crosby .......... G01R 31/318547 702/117 |

OTHER PUBLICATIONS

Yotsuyanagi et al., "Sequential Redundancy Removal Using Test Generation and Multiple Unreachable States", Proc. of Tenth Asian Test Symposium, Kyoto, Nov. 2001, DOI: 10.1109/ATS.2001.990253, pp. 23-28.

Liang et al., "An Effective Methodology for Mixed Scan and Reset Design Based on Test Generation and Structure of Sequential Circuits", Proceedings Eighth Asian Test Symposium (ATS'99), Nov. 18, 1999, DOI: 10.1109/ATS.1999.810747, 6 pages.

Kim et al., "Testable synthesis of synchronous sequential circuits considering strong-connectivity using undefined states", IEE Proc.-Comput. Digit, Tech., vol. 152, No. 1, Jan. 2005, pp. 107-112.

Boppana et al., "Partial Scan Design Based on State Transition Modeling", International Test Conference, Oct. 20-25, 1996, Paper 20.1, DOI: 10.1109/TEST.1996.557079, pp. 538-547.

Pomeranz et al., "Definition and generation of partially-functional broadside tests", IET Comput. Digit. Tech., 2009, vol. 3, No. 1, received on Oct. 24, 2007, revised on Jan. 27, 2008, pp. 1-13.

Kalla et al., "A Comprehensive Approach to the Partial Scan Problem Using Implicit State Enumeration", IEEE Transactions on Computer-Aided Design of Integrated Circuits and Systems, vol. 21, No. 7, Jul. 2002, pp. 810-826.

Huang et al., "AQUILA: An Equivalence Checking System for Large Sequential Designs", IEEE Transactions on Computers, vol. 49, No. 5, May 2000, pp. 443-464.

Fujita "Detection of test patterns with unreachable states through efficient inductive-invariant identification", 2015 IEEE 24th Asian Test Symposium, Nov. 22-25, 2015, Mumbai, India, pp. 31-36.

Yang, "Test Generation for Partially-Functional Broadside Tests", Thesis/Dissertation, Purdue University, Dec. 9, 2011, 39 pages.

* cited by examiner

| LOGIC MACROS | # OF NETS | | # USEFUL OF TAP POINTS PER PROBLEM-NET TO CHOOSE FROM | AVG. CONTROLLABILITY FOR FIXED NETS | |
|---|---|---|---|---|---|
| | CONSIDERED | FIXED | | BEFORE | AFTER |
| LOGIC MACRO 1 | 100 | 0 | 0 | -- | -- |
| LOGIC MACRO 2 | 100 | 100 | 3.29 | 0.046 | 0.477 |
| LOGIC MACRO 3 | 100 | 100 | 16.07 | 0.011 | 0.494 |
| LOGIC MACRO 4 | 100 | 10 | 0.79 | 0.043 | 0.478 |
| LOGIC MACRO 5 | 47 | 47 | 3.64 | 0.064 | 0.470 |
| LOGIC MACRO 6 | 100 | 100 | 3.04 | 0.039 | 0.481 |

SYNTHESIS FOR RANDOM TESTABILITY USING UNREACHABLE STATES IN INTEGRATED CIRCUITS

FIELD

The present disclosure relates generally to a method and system for testing integrated circuits and, more particularly, to a method and system for testing integrated circuits having random resistant output nets corresponding to unreachable states when the integrated circuits are in their functional mode.

BACKGROUND

Today's VLSI products are extremely complex in microarchitecture, circuit design and fabrication process. For a microprocessor with millions of transistors, it is almost impossible to prove that each was manufactured correctly without a proper testing strategy. Therefore, high performance high speed microprocessors demand much more efficient and effective testing technology than ever. In addition, the increasingly complex test methods require that designers comply with some test design rules when developing novel microarchitectures for their chips.

Digital circuits are tested using a variety of strategies including functional test patterns, deterministic structural test patterns, and random patterns. Random pattern testing is particularly significant because it requires relatively little test data and can be accomplished not only by automated test equipment, but by the digital circuit itself using Built-in Self Test (BIST) circuitry. In order to achieve high random pattern testability, it is often necessary to modify a digital circuit design such that random patterns more easily detect potential defects in the IC under test.

One technique for testing digital circuits is known as scan chains. With scan chains, testing is made easier by setting and observing every flip flop in an integrated circuit. A special signal normally referred to as scan enable is added to a design. When this signal is applied, each flip flop in the design is connected into a long shift register. One input pin is provided to feed data to the chain of flip flops, and one output pin is connected to the output of the chain of flip flops. By using the chip's clock signal, an arbitrary pattern can be entered into the chain of flip flops and the state of each flip flop can be read out. When a full scan design is being used, automatic test pattern generation is easy to implement. No sequential pattern generation is required and combinatorial tests can be used.

The added scan chain circuitry simplifies the application of manufacturing tests to a final product and can be used to validate intended behavior of a design and ensure that the product does not have defects.

The testing process can be performed manually during the design stage of the integrated circuit, or automatically when converting a design specification into an interconnection of transistors that define a final semiconductor product.

The testing may target either the functional or structural properties of an integrated circuit. In functional testing, an attempt is made to validate that the final product operates correctly, and its behavior is consistent with the original specification or its constrained specification. When targeting structural properties, design functions of the integrated circuit are not addressed. Instead, testing is performed at selected design points to determine if a circuit was manufactured correctly, or a design behaves correctly at isolated subset of points. In current design methodologies, structural testing is limited in practice due to difficulty of accessing tap points and limitations of test equipment.

Integrated circuits are tested using a variety of strategies including functional test patterns, deterministic structural test patterns, and random patterns. Random pattern testing is particularly significant because it requires relatively little test data and can be accomplished not only by automated test equipment, but by the circuit itself using Built-in Self Test (BIST) circuitry. In order to achieve high random pattern testability, it is often necessary to modify a digital circuit design such that random patterns more easily detect potential defects in the IC under test.

Figure 1:
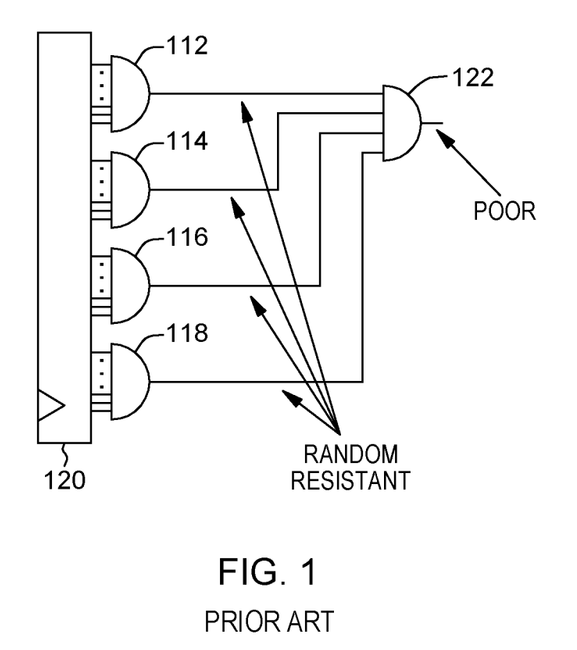
FIG. 1 is a diagram of a prior art random resistant circuit.

One way of modifying digital circuits to provide improve random pattern testability using reachable states is known as test point insertion. During test point insertion, additional logic and scannable latches are added to the logic to provide additional points of control or observation during testing. Referring to FIG. 1, there is shown a prior art random-resistant circuit which exhibits poor toggling activity due to addition of wide AND gates 112, 114, 116, 118 coupled to existing latches 120 and having respective outputs connected as inputs to an AND gate 22. A test enable signal is used to activate logic needed in a testing mode. Activation is performed by setting the signal value, (e.g., a Test Enable signal), to, for example, a logic 1 state, which activates AND gate 122, and in turn enables control-improving logic.

Figure 2:
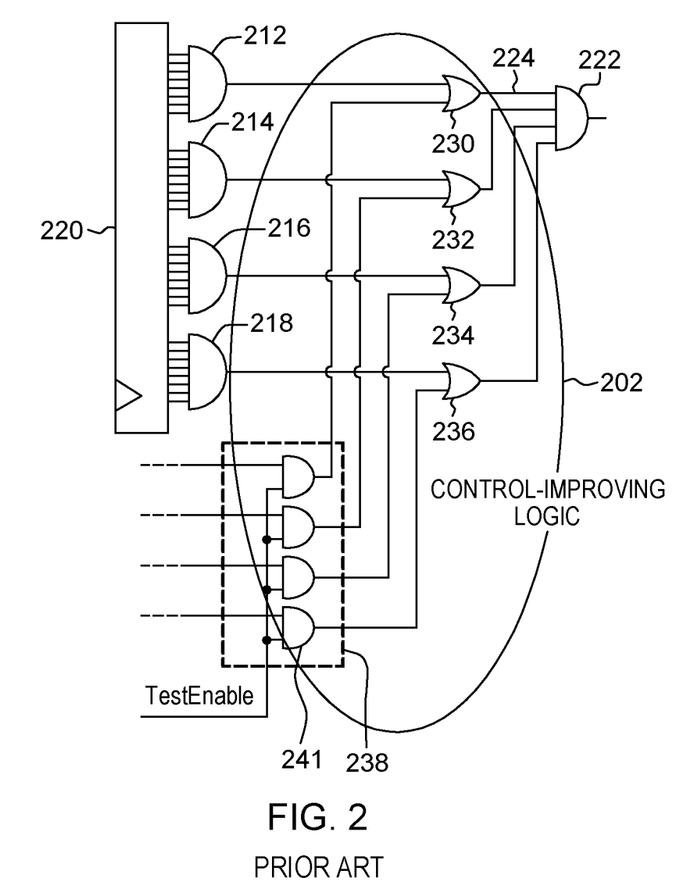
FIG. 2 is a diagram of a prior art scan test circuit that uses test enable signals to activate a scan test circuit for a testing mode.

Referring to FIG. 2, a logic circuit 202 is inserted between the output of AND gates 212, 214, 216 and 218 and the input terminals of AND gate 222. The signal feeding the input terminals 224 of a four input AND gate 222 are nearly always 0 when random patterns are applied to the circuit, since each input AND gate 212, 214, 216, 218 will produce a logic 1 very infrequently. Such a path is rarely sensitized to allow faults to propagate through downstream AND gate 22. Furthermore, faults in the downstream logic that require logic 1 for activation will rarely be activated. If, however, a control 1 test point is added to the circuit, the random pattern testability substantially improves.

Continuing with FIG. 2, adding OR gates 230, 232, 234, 236 driven by a latch that can be scanned will improve the probability that logic 1's will appear on the inputs to the four input AND gate 222, and will propagate to downstream logic to enable the detection of certain faults not otherwise tested. Additional faults will be allowed to propagate through the four inputs of the AND gate 222, and faults located in downstream logic requiring a logic 1 for activation will have a much higher probability of being activated. OR gates 230, 232, 234, 236 which are driven by scannable latch 238 implemented as AND gates 241 and having one input of each tied to a test enable signal is known as a control 1 test point. In other cases, a control 0 test point (implemented as an AND gate) or an observation point (implemented as a signal feeding a scannable latch) may be inserted. It is understood that additional latches (not shown) have to be respectively added to the design to provide the other control input signal to each respective AND gate 241 for testing purposes.

Most integrated circuit designs have states that are never reached in the functional mode, i.e., in normal execution.

SUMMARY

A system, method and computer program product for accessing these (functional mode) unreachable states during a testing mode of operation to generate desired test patterns.

In one aspect, there is provided a method of modifying an integrated circuit such that its original behavior is preserved when in its functional mode, while its unreachable states are used in a testing mode to increase random testability of the circuit. In one embodiment, by means of scan chains, integrated circuits can be initialized to a desired "test state" rather than to a "functional state". Such initialization is performed without having to go through many clock cycles. In one embodiment, existing logic circuit nets corresponding to unreachable states and subsets thereof are used to initialize an integrated circuit to a state that is not reachable in its functional mode.

Advantageously, the invention yields minimum area penalty on a circuit by utilizing its existing functional signals (i.e., nets), and avoids use of an explicit extra test enable signal.

In a further aspect, there is provided a method of testing an integrated circuit having a random resistant logic circuit that exhibits limited controllability or observability of random resistant output signals in a functional mode of operation. The method comprises: providing control-improving logic circuit operatively connected to the random resistant logic circuit; and receiving, at the control-improving logic circuit, input net signals corresponding to unreachable states of the random resistant logic circuit during the functional mode of operation; and activating the control-improving logic circuit responsive to the input net signals in a testing mode of operation to increase controllability of the random resistant output signals, the activated control-improving logic circuit preserving original functionality of the output signals of the random resistant logic circuit responsive to the input net signals in the functional mode, and yielding new output signals of the combinational logic circuit corresponding to the unreachable states for testing the random resistant logic circuit in the testing mode of operation, the unreachable states being a state of the integrated circuit that can be accessed only during the testing mode of the integrated circuit and is not reachable when the integrated circuit is operating in the functional mode.

In a further embodiment, there is disclosed a system of testing an integrated circuit having a random resistant logic circuit that exhibits limited controllability of random resistant output signals in a functional mode of operation. The system comprises: a control-improving logic circuit operatively connected to the random resistant logic circuit; the control-improving logic circuit configured to receive input net signals corresponding to unreachable states of the random resistant logic circuit during the functional mode of operation; and the control-improving logic circuit configured for automatic activation responsive to the input net signals in a testing mode of operation to increase controllability of the random resistant output signals, the activated control-improving logic circuit preserving original functionality of the output signals of the random resistant logic circuit responsive to the input net signals in the functional mode, and yielding new output signals of the combinational logic circuit corresponding to the unreachable states for testing the random resistant logic circuit in the testing mode of operation, the unreachable states being a state of the integrated circuit that can be accessed only during the testing mode of the integrated circuit and is not reachable when the integrated circuit is operating in the functional mode.

In a further aspect, there is provided a computer-implemented method of using unreachable states as don't care conditions to change logic of an integrated circuit design. The method comprises: determining, using a hardware processor, from an existing logic circuit design, unreachable states; computing, using the hardware processor, "don't care" values in terms of the unreachable states; propagating, using the hardware processor, the don't care values to a circuit having a local logic gate in a region of the existing logic circuit design having outputs of limited controllability; and modifying, using the hardware processor, the circuit having the local gate to increase its random testability by one of: adding don't care values if the local gate exhibits limited 0-controllability, or subtracting don't care values if the local gate exhibits limited 1-controllability.

In a further aspect, there is provided a computer program product for performing operations. The computer program product includes a storage medium readable by a processing circuit and storing instructions run by the processing circuit for running the method to change logic of an integrated circuit design.

DETAILED DESCRIPTION

There is disclosed a test circuit having control circuit logic which improves testability of digital circuits. The control circuit logic remains "inactive" when a manufactured integrated circuit is in its functional mode, but is "activated" during a testing mode of the integrated circuit. Thus, "unreachable states", those states of an integrated circuit that are accessed only during a testing procedure, are not reachable when an integrated circuit is in its functional mode. Thus, the test circuit is generated selectively for random resistant logic regions that exhibit limited controllability in functional mode.

The test circuit provides improved controllability of random resistant logic when an integrated circuit is in its testing mode by activating test circuitry in states that are not reachable when the integrated circuit is being tested. Unreachable states are not accessed during normal functionality of the integrated circuit.

Unreachable states of the test circuit do not affect the operation of an integrated circuit when the integrated circuit is in its functional mode.

Utilization of unreachable states of an integrated circuit makes explicit use of a test enable signal unnecessary. In addition, a more compact implementation of test circuit is obtained. In one embodiment, FIG. 3 provides a test circuit that avoids using the explicit test-enable signal, and instead "synthesizes" it from unreachable states of a design.

Figure 3:
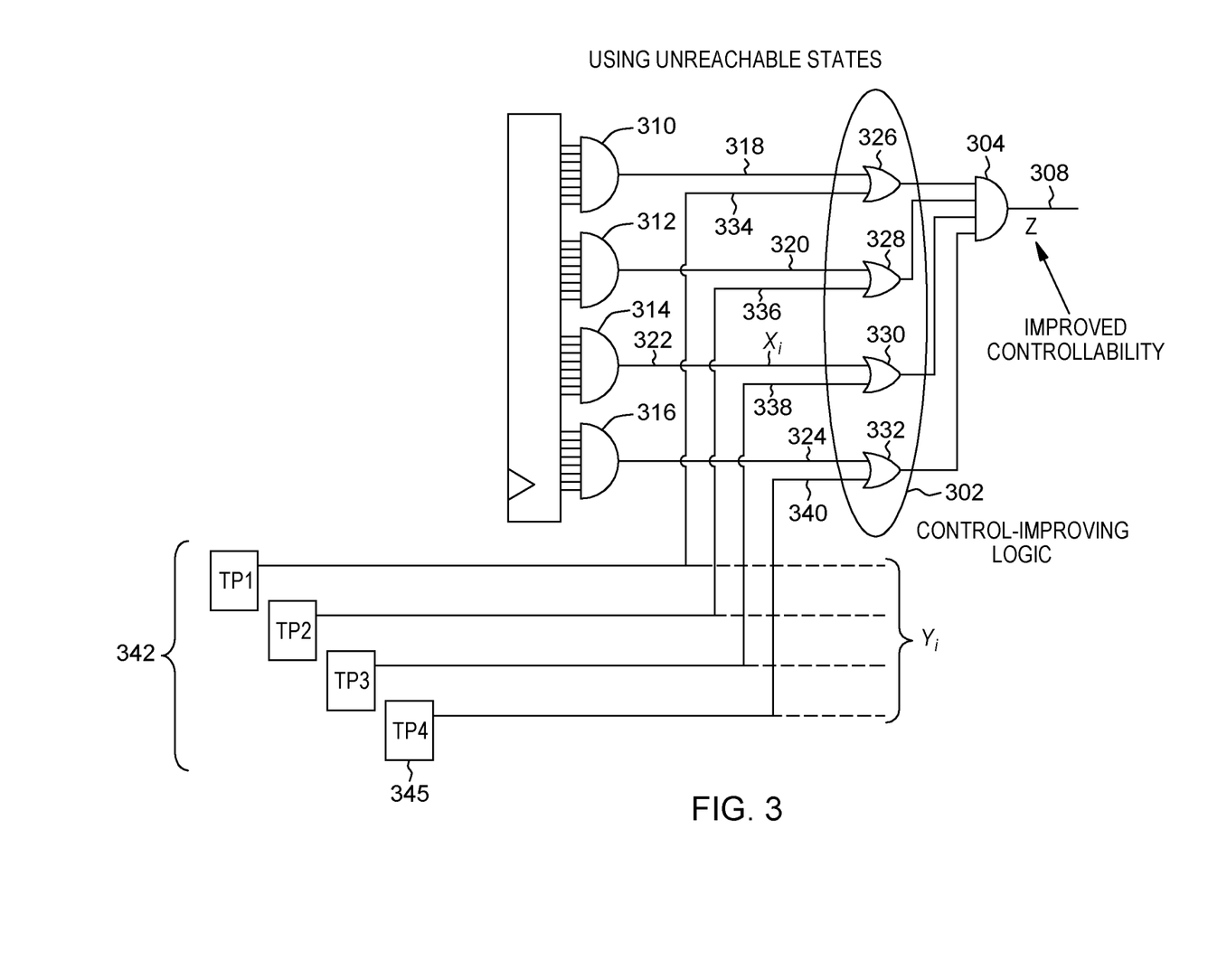
FIG. 3 is a diagram of a scan test circuit that utilizes unreachable states in accordance with an embodiment.

Referring to FIG. 3, there is illustrated an embodiment that uses test enable signals to activate a circuit 302 having logic that is needed for a test mode which provides improved controllability of a signal "Z" at output terminal 308 of AND gate 304, a four input AND gate in the example shown. In FIG. 3, the outputs of AND gates 310, 312, 314, 316 are fed to input terminals 318, 320, 322, 324 of respective OR gates 326, 328, 330, 332. Second input terminals 334, 336, 338, 340 of the respective OR gates are coupled to outputs of existing latches 342 added to improve random testability, and each latch 345 providing a test point (TP) input. A "1" or a "0" signal on terminals 318-324 connected as inputs of a respective OR gate 326-332 received from AND gates 310-316 is designated as $X_i$ with i being the number of AND/OR gates, and a "1" or a "0" signal received on input terminals 334-340 of OR gates 326-332 from existing latches 342 of the integrated circuit is designated $Y_i$ with i being the number of AND/OR gates. The outputs of each OR gate 326-332 is fed to a respective input terminal of AND gate 304, e.g., a 4-input terminal AND gate in the embodiment depicted.

The circuit of FIG. 3 may uses test enable signals (e.g., TP1-TP4) to activate OR gates of control logic circuit 302 to access unreachable states during a testing mode. Activation of the unreachable states effected by setting the signal value on input terminals 334-340 of a respective OR gate 326-332 to a "1" activates AND gate 304.

In the embodiment of FIG. 3, a test enable signal is not needed, and an integrated circuit, i.e., existing circuit latches 342, provide test points, e.g., TP1-TP4 that force the system into a test mode where the test of the integrated circuit is made using unreachable states.

For example, in FIG. 3, signals $Y_i$ must be 0 when $X_i$=0 in reachable states. An example of a signal $Y_i$ is an output signal of a latch 345 that is always 0 in its reachable state space. Control point signals $Y_i$ are unconstrained in the unreachable state space and mitigate the random resistance nets $X_i$, i.e., toggle their values. Thus, increased design testability can be obtained. For example, if latch output signal $y_i$ is 0 in a reachable state space, then setting latch value to 1 will increase controllability of signal Z (increase stability of the design using unreachable states that are not achieved during the specified behavior of the device).

Thus, unreachable states form don't care conditions that are ignored when an integrated chip is in its functional mode and improved controllability is obtained in a testing mode of an integrated circuit.

Figure 4:
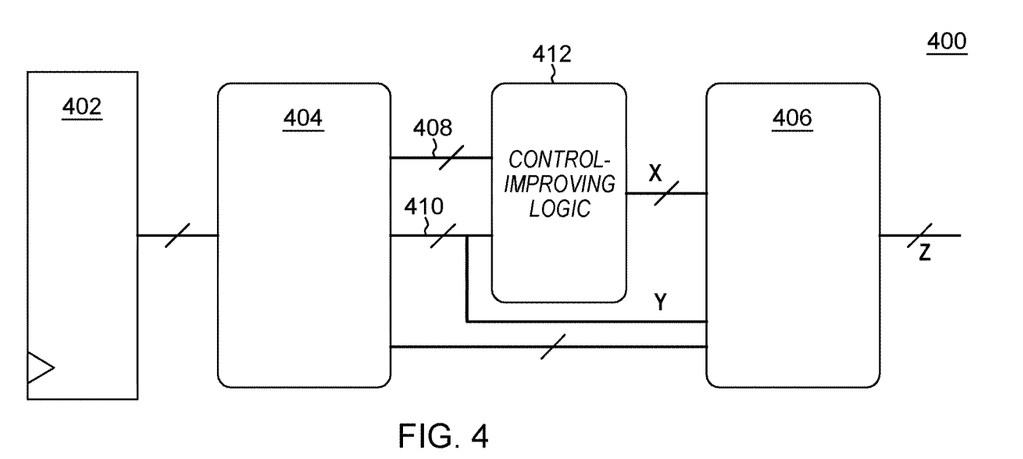
FIG. 4 is a functional block diagram of a generic controllability template (circuit) for improving controllability of net X signals in accordance with the embodiment.

Referring to FIG. 4, there is shown a functional block diagram of an embodiment of a generic controllability circuit or template 400 for providing increased controllability of signal Z in FIG. 4, block 404 represents combinational logic coupled at their input terminals to existing latches 402 and providing random resistant nets X, 408, and controlling nets Y, 410. Block 406 represents a logic circuit. Located between block 404 and block 406 is a generic control logic circuit 412 coupled to receive random resistant nets X (e.g., from combinational logic of block 404) to provide improved control of forward logic output of circuit 406. With this embodiment the original behavior of both random resistant nets X and controlling nets Y is preserved in the functional mode of the integrated circuit. The control-improving logic circuit 412 yields new values of random resistant nets $X_i$ in the unreachable states during testing mode.

Figure 5:
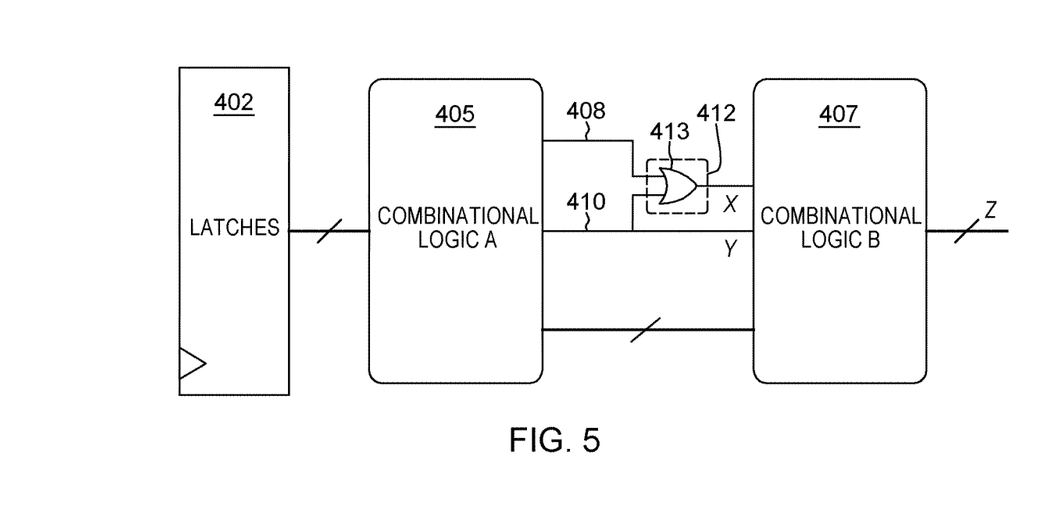
FIG. 5 illustrates use of an OR gate as a control-improving circuit logic of FIG. 4.

The block diagram of FIG. 4 is further modified and shown in FIG. 5 as a "logic reuse" template where control logic circuit 412 is further defined in a non-limiting embodiment. As shown in FIG. 5, outputs of existing latches 402 are input to an existing combinational logic A circuit 405 which is non-memory combinational logic of the existing IC design (specification). As shown in FIG. 5, the control logic circuit 412 includes an OR gate 413 coupled to receive as inputs a random resistance net signal 408 and controlling net signal 410. The random resistance signals of net X in FIG. 5 are improved by virtue of OR-ing them with the controllable signals of controlling net Y. OR-ing of the signals preserves original behavior of the integrated circuit when in its functional mode, and increases toggling activity in the unreachable states of the integrated circuit. In view of FIG. 5, the addition of OR gate 413 increases 1-controllability of the combinational logic circuit 406 (e.g., if 1-controllability is lacking), and the ability to generate unreachable states in testing mode increases controllability of net X. In a similar manner, to increase 0-controllability, the logic gate 412 of FIG. 4 may be replaced with an AND gate (e.g., if 0-controllability is lacking). With use of logic reuse template shown in FIG. 5, the wiring overhead could be significant while the number of feasible fixes is high. In the embodiment shown, output combinational logic B circuit 407 may include existing combinational logic of the existing IC design (specification) (i.e., non-memory) providing increased controllability output signal Z.

To help preserve the behavior of the integrated circuit in its functional mode, the following condition must be satisfied for the functions of signals (i.e., nets) X and Y:

$$f_x \not\equiv f_y.$$

where every signal in X and Y is described by a Boolean function ($f_x$, $f_y$) (i.e., a logic structure), and these functions are compared to each other. This condition indicates that a signal in Y can be conjoined with a signal X (e.g., OR it with X) to increase controllability. For example, if $f_x$=1 whenever $f_y$ is 1, then this control-improving logic may be implemented.

In one embodiment, performing these comparisons may generate test controlling points candidates as this condition ensures the behavior of the IC circuit design will not change and remain consistent with the original design (specification). Functionally, these Boolean functions $f_x$, $f_y$ for signals are not dependent upon each other, however may be from the same cone of logic or share the same net structure, albeit functionally unrelated (e.g., orthogonal).

This condition does not have to be satisfied when the integrated circuit is in its testing mode. That is, in testing mode X has better controllability if this condition is not satisfied in the unreachable states. That is, values are produced from unreachable states (previously not possible to generate) and hence increase the ability to control or test the circuit.

According to an embodiment, controllability of a net is measured as the worst ratio of 0's or 1's at the net for all possible input signal vectors. That is:

controllability(net)=MIN(#0's/$2^n$,#1's/$2^n$)

where n is the number (#) of inputs to the cone of net (i.e., a combination of 0's and 1's input vector). For example, evaluation of each of the fractions #0's/$2^n$, #1's/$2^n$ will indicate how difficult it is to achieve 1-controllability or 0-controllability/. For example, if most patterns generate 0's for that net, then the net will lack 1-controllability; if most patterns generate 1's for the net, then this net will exhibit poor 0-controllability. Nets with controllability <0.1 are fixed using 2-input OR- or AND-gating. In one aspect, control improving logic is added to achieve closer to a 50% occurrence of 0 and 1.

Figure 10:
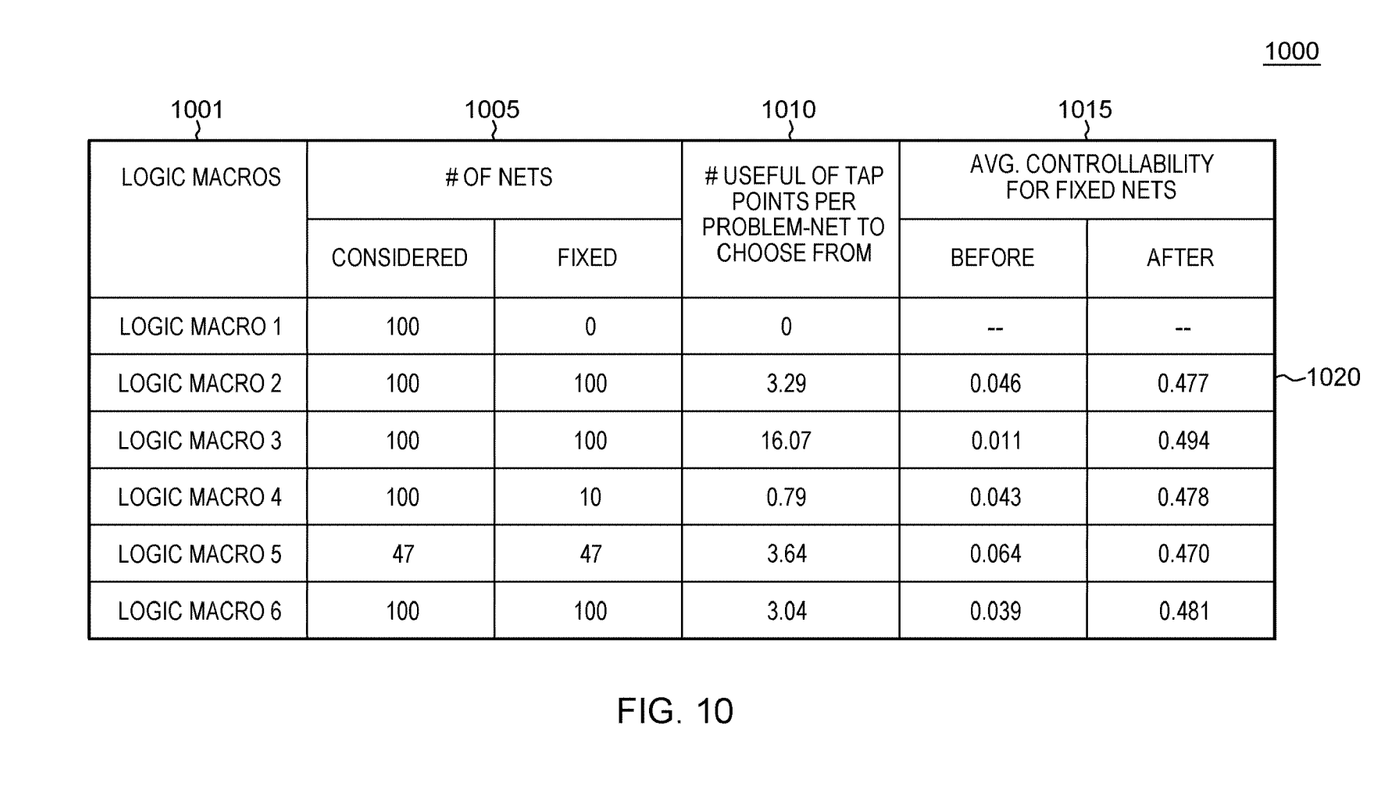
FIG. 10 shows a table depicting example average controllability calculation results for various logic macros of an example design specification.

FIG. 10 shows a table 1000 depicting example average controllability calculation results for various logic macros 1001, e.g., Logic Macros 1-6, of a design specification. For each logic macro, by applying a controllability (logic change) determination algorithm to increase the controllability of nets, the second columns 1005 indicates the corresponding number of nets considered compared to the number of "fixed" nets having improved controllability. For example, final column 1015 shows comparison of the average controllability for the number fixed nets both before and after fixing the net. For example, for Logic Macro 2 net 1020, there is shown that before fixing controllability of the net, the average computed controllability (net) value was 0.046 (i.e., for both 1-controllability and 0-controllability), however after fixing the net by adding control-improving logic, the average computed controllability (net) value became 0.477. It is understood that, in an ideal embodiment, a computed controllability value of 0.5 would indicate that the net is equally controllable in both 1-controllability and 0-controllability. Values indicated in column 1010 indicated the number of useful tap points per problem-net to choose from. That is, corresponding values in column 1010 for Logic Macros indicate the number of candidates for the Y signals (control points) for fixing a difficult net.

The functional block diagram of the embodiment of a generic circuit for providing control of signal Z shown in FIG. 4 has a variant where unreachable states are used as don't care conditions to change logic of a circuit. A logic change algorithm that can be used to achieve such logic change is shown in FIG. 6.

Figure 6:
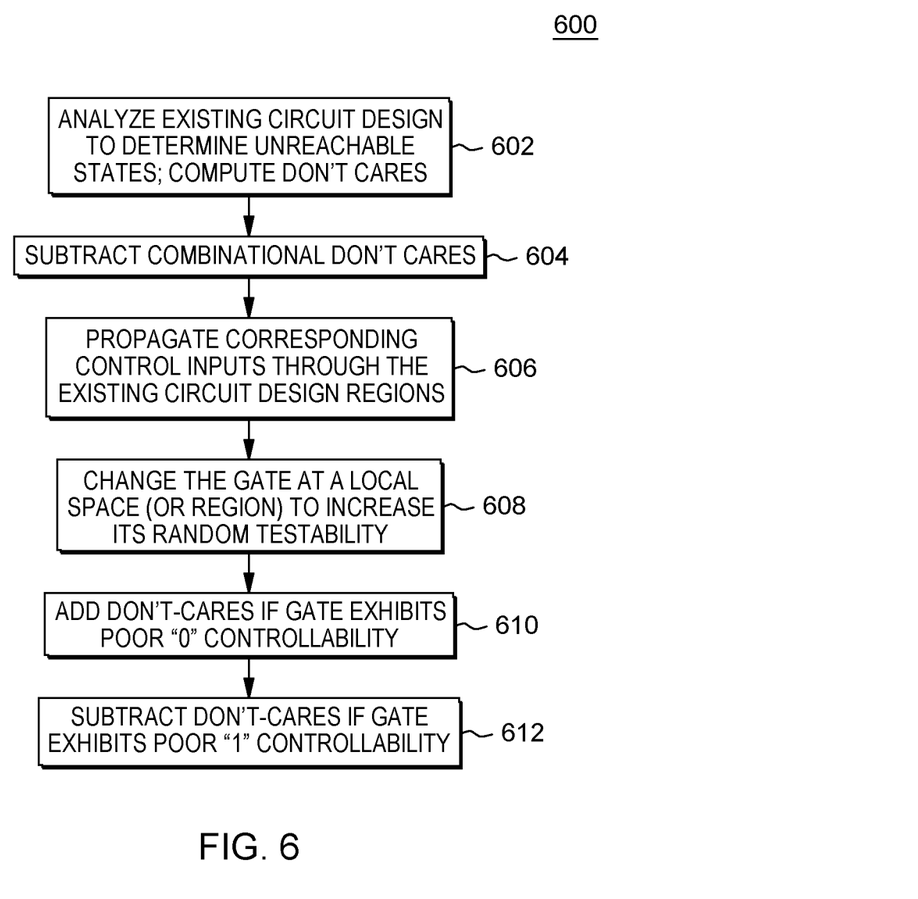
FIG. 6 is a flow chart of an algorithm for changing control circuit logic.

In one embodiment, FIG. 6 outlines a method 600 for determining control-improving logic that may be added to increase net X controllability. Referring to FIG. 6, the existing IC design specification is analyzed to determine all unreachable states. That is, all "don't cares" are computed in terms of unreachable states, at block 602. Then, from the set of all unreachable states, there is subtracted all combinational don't cares which are output from combinational logic of the existing design at block 604. That is, forward combinational logic circuit may mask propagation of "don't cares" to unreachable states at the outputs, so it is desired that these combinational logic circuit "don't cares" are removed. Then, the control nets signals (net Y) corresponding to the "don't care" states are propagated to a local gate or space of a region of the circuit at block 606, e.g., an AND gate, to obtain bit vectors having values for each of the unreachable states. This bit vector will be assigned to every net in the logic. In one embodiment, every net in the logic may be annotated with the bit vector of values for the unreachable states. Then the local gate is changed to increase its random testability, block 608 accounting for the flexibility afforded by the added don't care values at the gate. Then the method performs determining whether the logic is poorly "0" controllable or poorly "1" controllable, where poor "1" controllability implies that most of the time a signal has value "0", and rarely evaluates to "1" and poor "0" controllability implies that most of the time a signal has a value "1" and rarely evaluates to "0". FIGS. 7A-7D depicts an example logic net X having poor "0" controllability. Then, if it is determined that the gate exhibits poor "0" controllability the don't cares are added, block 610 (e.g., see FIG. 7D). If the gate exhibits poor "1" controllability the don't cares are subtracted, block 612.

Figure 7A:
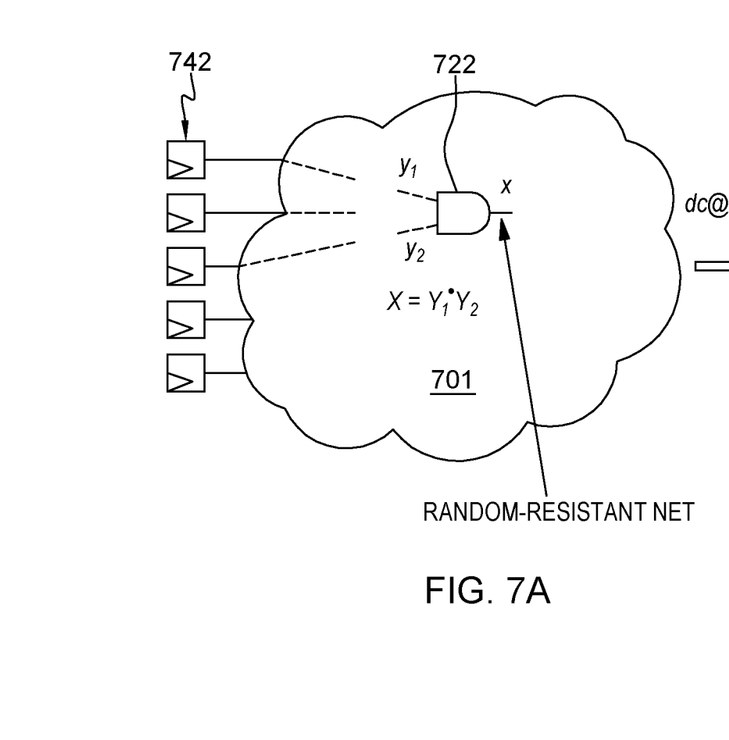
FIGS. 7A, 7B illustrates an example logic change template comprising a circuit for changing a control circuit logic of FIG. 7A to restrict use of control-improving nets as fanins of net x logic shown in FIG. 7B in a non-limiting embodiment.
Figure 7B:
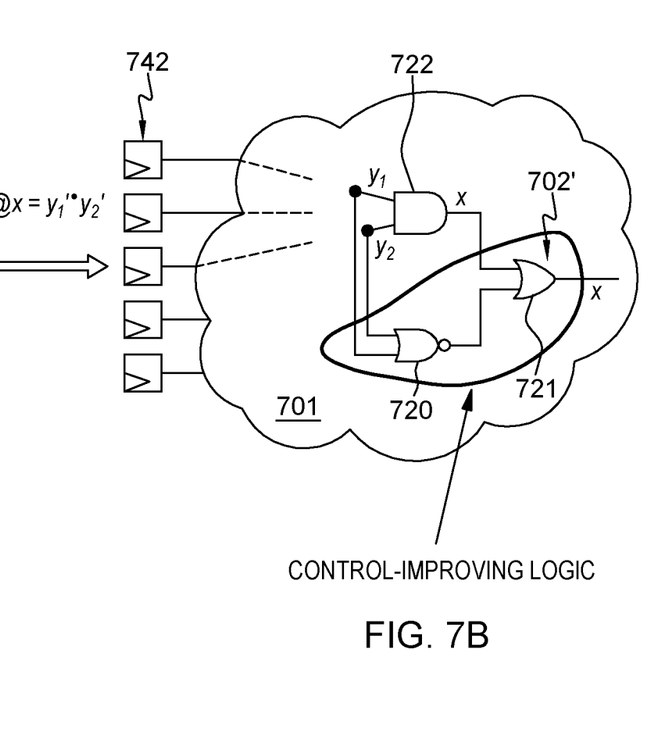

FIG. 7A depicts an example of a general logic change template 700 for an integrated circuit 701 which is a more restricted form of the generic controllability template such as shown in FIG. 4. As shown in FIG. 7B, after applying the algorithms of FIG. 6, there is a resulting logic restructuring to improve controllability of net X. For example, existing latches 742 generate controlling net signals $y_i$, e.g., signals $y_1$, $y_2$ and these control-improving nets $y_i$ are don't care signals input to the AND gate 722 in FIG. 7A (providing poor controllability of the random resistance net X). However, as a result of the logic change algorithm, there is determined additional don't care states $y_1' \cdot y_2'$, (labeled according to a notation dc@x=$y_1' \cdot y_2'$) which indicates "don't care" values that will not occur, e.g., a combination of values $y_1' \cdot y_2'$ for signals $y_1$, $y_2$ that will never occur (e.g., values $y_1$=0 and $y_2$=0). In the embodiment of FIG. 7B, the control-improving nets $y_i$ are further provided as fanin signals of the net X restructured control-improving logic circuit 702'. For example, control-improving nets $y_1$, $y_2$ are shown as being additionally input to a two-input NOR circuit 720 which generates an output to an OR circuit 721 configured to receive the random-resistance net signal X. In this embodiment, use of the logic change template requires minimal area overhead and results in no wiring penalty. As a trade-off, the number of feasible fixes is limited.

Figure 7C:
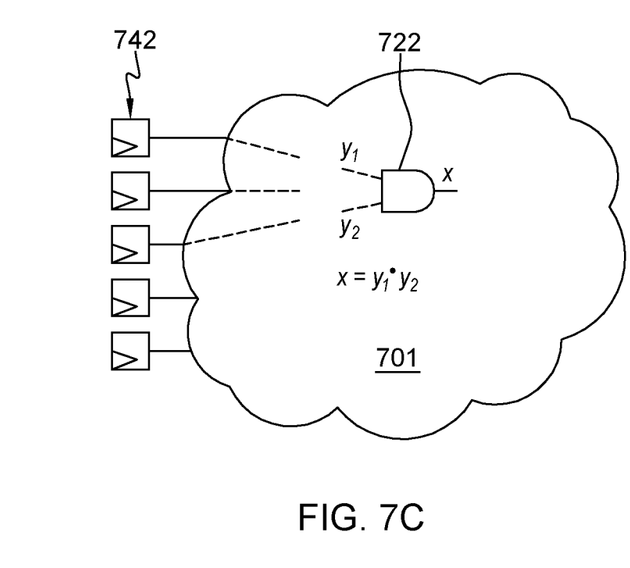
FIGS. 7C, 7D illustrates an example implementation of the logic change algorithm of FIG. 6 depicting a change of the logic forming the random-resistant net X from an AND gate shown in FIG. 7C to an exclusive-OR gate shown in FIG. 7D in a non-limiting embodiment.
Figure 7D:
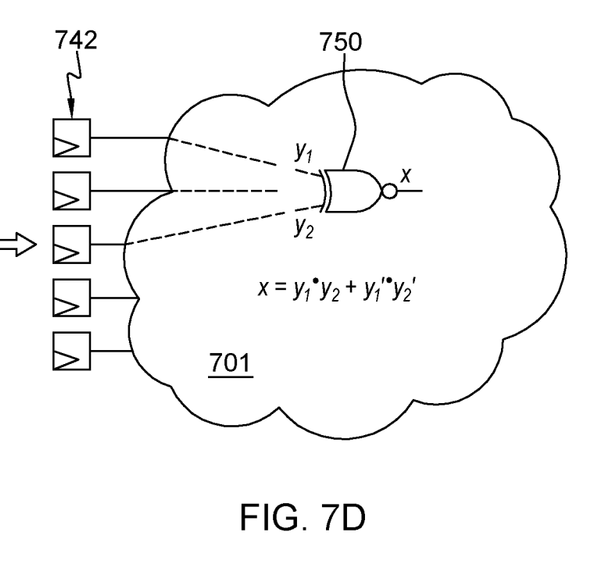

FIGS. 7C, 7D illustrate the application of the logic change algorithm of FIG. 6 enabling control-improving logic restructuring by replacing the function of an AND gate with an XOR gate for increased "0" controllability. As shown in FIG. 7C, latches 742 of the existing design generate controlling net signals $y_i$, e.g., signals $y_1$, $y_2$ and these control-improving nets $y_i$ are input to the AND gate 722 (providing poor controllability) as in FIG. 7B resulting in a function x=$y_1 \cdot y_2$. Applying the logic change algorithm of FIG. 6, there results in the determining of the additional "don't care" values $y_1' \cdot y_2'$ corresponding to unreachable states. Thus, as shown in FIG. 7D, these added "don't care" values $y_1' \cdot y_2'$ are added to the X signal to increase "0" controllability of the logic AND gate and hence increase stability. Thus, the determined pattern of "don't care" values $y_1' \cdot y_2'$ (unreachable states) is added to the existing functionality of the gate in order to increase its controllability, resulting in a function x=$y_1 \cdot y_2 + y_1' \cdot y_2'$. That is, from the determining of the additional unreachable states $y_1' \cdot y_2'$, these states are used to change the AND gate 722 of FIG. 7C to an XOR gate 750 of FIG. 7D for receiving the control-improving nets $y_i$ to increase the random testability of the integrated circuit 701. The changing of the circuit to handle these additional unreachable states increases random testability of this logic net, thus rendering the net X increased random resistant.

Figure 8:
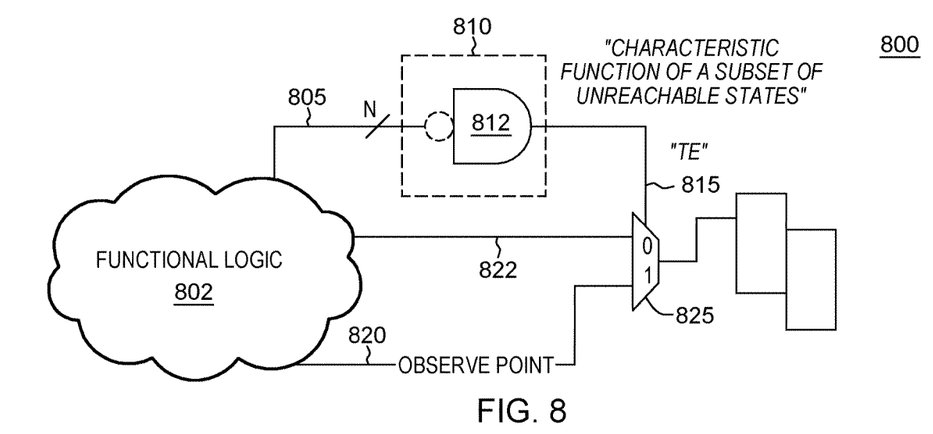
FIG. 8 depicts the addition of a circuit functioning to use an unreachable state as a "test enable" function in a non-limiting embodiment.

FIG. 8 depicts the addition of a further circuit 800 that uses an unreachable state as a "test enable" function. In this embodiment, the "test enable" is equivalent to an impossible machine state. That is, functional logic 802 of the existing digital circuit design specification is configured to provide an N-bit wide unreachable state signal or net 805 that is used as a test enable (TE) signal 815. In the embodiment shown, a further logic circuit 810 is added that receives the output N-bit wide unreachable state signal or net 805 and resolves this input net 805 using the circuit logic to output a "true".

In one embodiment, the logic at circuit 810 generates "true" when the N-bit wide unreachable state is asserted. For example, the circuit 810 provides for inverting the net signals and reducing the (inverted) signals with an AND gate 812, e.g., having outputs feeding into an OR gate (not shown). Circuit 810 embodies a "characteristic function" of a subset of unreachable states which resolves to output a "1" for example, when an unreachable state is input, or a "0" if not an unreachable state input. Adding the logic implemented at 810 to the circuit 800 advantageously requires no extra design pin or latch to implement observation points 820. Thus, in one embodiment, in enabling a testing mode automatically upon generating unreachable state net 805, a multiplexer 825 receives the generated TE signal 815 to configure it to pass through an observe point signal 820 (testing point) that is an output of the combinational logic 802 to be tested and may have a value which is difficult to observe due to poor controllability. Otherwise, with TE signal 815 not asserted, a regular functional state output 822 is provided at the multiplexor output. In another implementation, in place of the mux 825, the test enable signal fed by the unreachable state could be directly ANDed or Ord with the random resistant logic to alter the frequency of being in a 0 or 1 state.

Figure 9:
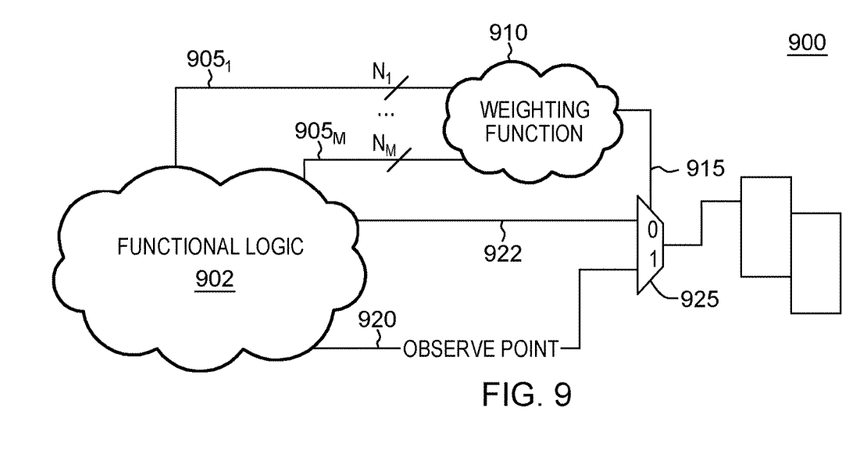
FIG. 9 depicts the addition of a circuit functioning to render the "test enable" function more or less active using an unreachable state in a non-limiting embodiment.

In a further embodiment, additional logic circuitry may be added to the circuit 800 of FIG. 8 to temper the activity of the generated "test enable" signal. FIG. 9 shows a circuit 900 that renders the "test enable' signal 915 more or less active upon receipt of an intelligent selection of unreachable states $905_1, \ldots, 905_M$ to increase stability. In the embodiment depicted, weighting function circuit 910 implements logic to generate/assert the "Test enable" signal 915 upon receipt of a subset of unreachable states. The weighting function 910 is configured to have a desired activity with random tests, which may not match the activity of unreachable states. That is, weighting function 910 may provide a weight on the desired behavior of the design when in testing mode so that: (1) it best reflects on the existing test-set of random inputs (it should "on" for those tests); (2) the silicon implementing it should meet a given budget; and (3) it is able to observe certain paths more frequently. Thus, in enabling a testing mode automatically upon generating an unreachable state net $905_1, \ldots, 905_M$, a multiplexer 925 receives the generated TE signal 915 to configure it to pass through an observe point signal 920 (testing point) that is an output of the combinational logic 902 to be tested and may have a value which is difficult to observe due to poor controllability. Otherwise, with TE 915 not asserted, a regular functional state output 922 is provided at the multiplexor output.

Figure 11:
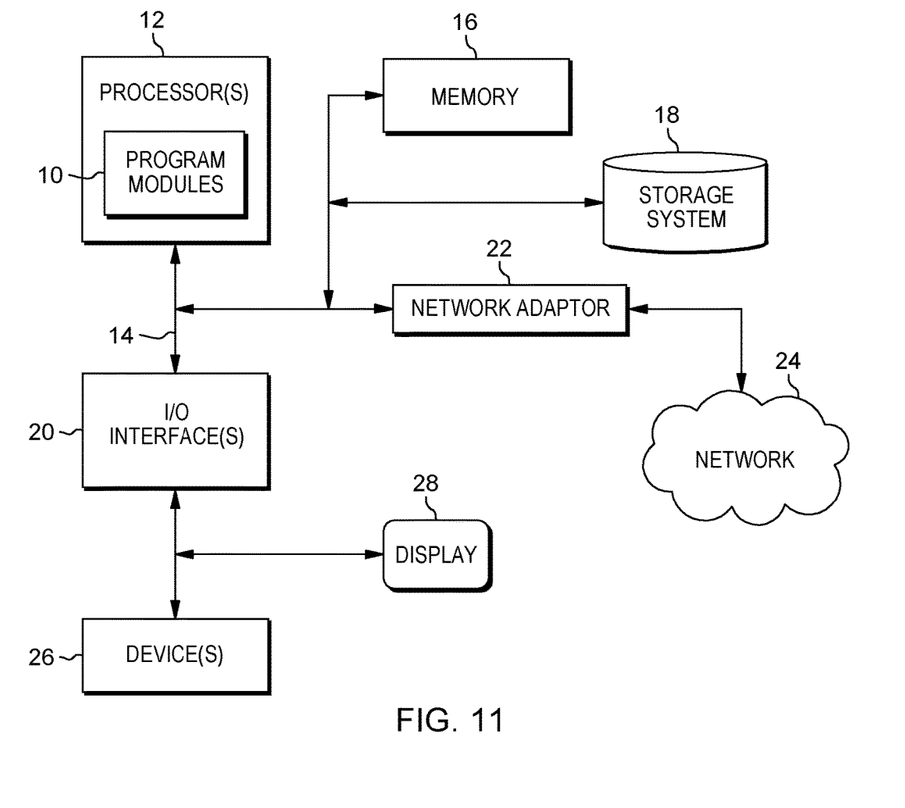
FIG. 11 illustrates an example computing system in accordance with an embodiment.

FIG. 11 illustrates an example computing system in accordance with the present invention that may be configured to implement the logic change algorithm depicted in FIG. 6. It is to be understood that the computer system depicted is only one example of a suitable processing system and is not intended to suggest any limitation as to the scope of use or functionality of embodiments of the present invention. For example, the system shown may be operational with numerous other general-purpose or special-purpose computing system environments or configurations. Examples of well-known computing systems, environments, and/or configurations that may be suitable for use with the system shown in FIG. 11 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

In some embodiments, the computer system may be described in the general context of computer system executable instructions, embodied as program modules stored in memory 16, being executed by the computer system. Generally, program modules may include routines, programs, objects, components, logic, data structures, and so on that perform particular tasks and/or implement particular input data and/or data types in accordance with the methods described in FIG. 6.

The components of the computer system may include, but are not limited to, one or more processors or processing units 12, a memory 16, and a bus 14 that operably couples various system components, including memory 16 to processor 12. In some embodiments, the processor 12 may execute one or more modules 10 that are loaded from memory 16, where the program module(s) embody software (program instructions at the social device application or social network server) that cause the processor to perform one or more method embodiments of the present invention. In some embodiments, module 10 may be programmed into the integrated circuits of the processor 12, loaded from memory 16, storage device 18, network 24 and/or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system may include a variety of computer system readable media. Such media may be any available media that is accessible by computer system, and it may include both volatile and non-volatile media, removable and non-removable media.

Memory 16 (sometimes referred to as system memory) can include computer readable media in the form of volatile memory, such as random access memory (RAM), cache memory an/or other forms. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

The computer system may also communicate with one or more external devices 26 such as a keyboard, a pointing device, a display 28, etc.; one or more devices that enable a user to interact with the computer system; and/or any devices (e.g., network card, modem, etc.) that enable the computer system to communicate with one or more other computing devices. Such communication can occur via Input/Output (I/O) interfaces 20.

Still yet, the computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with the computer system. Examples include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of testing an integrated circuit having a random resistant logic circuit that exhibits limited controllability or observabilty random resistant output signals, said method comprising:
   providing control-improving logic circuit operatively connected to said random resistant logic circuit; and
   receiving, at said control-improving logic circuit, input net signals corresponding to unreachable states of said random resistant logic circuit during said functional mode of operation; and
   activating said control-improving logic circuit responsive to said input net signals in a testing mode of operation to increase controllability of said random resistant output signals, said activated control-improving logic circuit preserving original functionality of said output signals of said random resistant logic circuit responsive to said input net signals in the functional mode, and yielding new output signals of said combinational logic circuit corresponding to said unreachable states for testing said random resistant logic circuit in said testing mode of operation, said unreachable states being a state of said integrated circuit that can be accessed only during the testing mode of said integrated circuit and is not reachable when said integrated circuit is operating in the functional mode.

2. The method of claim 1, wherein said control-improving logic circuit is active during a testing mode of said integrated circuit and remains inactive when said integrated circuit is in its functional mode.

3. The method of claim 2, using existing logic circuitry of said integrated circuit to generate said input net signals for said activating said control-improving logic circuit.

4. The method of claim 2, wherein said integrated circuit is forced into said testing mode of operation without using a test enable signal.

5. The method of claim 1, wherein said random resistant logic circuit lacks "1"-controllability, said control-improving logic circuit including an OR gate for increasing said "1"-controllability of said random resistant logic circuit.

6. The method of claim 1, wherein said random resistant logic circuit lacks "0"-controllability, said control-improving logic circuit including an AND gate for increasing said "0"-controllability of said random resistant logic circuit.

7. The method of claim 4, further comprising:
   automatically activating said testing mode of operation responsive to receiving said input net signals corresponding to said unreachable states or a subset of said unreachable states at said control-improving logic circuit.

8. The method of claim 4, further comprising:
   receiving, at a weighting function circuit, plural input net signals corresponding to subsets of unreachable states at each of different circuit paths of said integrated circuit;
   applying a weight to each of said plural input net signals received for each path; and
   automatically activating said control-improving logic circuit corresponding to a input net signals of a circuit path based on said applied weight.

9. A computer-implemented method of using unreachable states as don't care conditions to change logic of an integrated circuit design, said method comprising:
   determining, using a hardware processor, from an existing logic circuit design, unreachable states;
   computing, using the hardware processor, "don't care" values in terms of said unreachable states;
   propagating, using the hardware processor, said don't care values to a circuit having a local logic gate in a region of said existing logic circuit design having outputs of limited controllability; and
   modifying, using the hardware processor, said circuit having said local gate to increase its random testability by one of: adding don't care values if said local gate exhibits limited 0-controllability, or subtracting don't care values if said local gate exhibits limited 1-controllability.

10. The computer-implemented method of claim 9, wherein said existing logic circuit design includes a combinational logic circuit for generating net signals, said method further comprising:
    subtracting from said computed "don't care" values combinational don't care values which are output from combinational logic circuit of the existing design.

11. A system of testing an integrated circuit having a random resistant logic circuit that exhibits limited controllability of random resistant output signals in a functional mode of operation, said system comprising:
    a control-improving logic circuit operatively connected to said random resistant logic circuit;
    said control-improving logic circuit configured to receive input net signals corresponding to unreachable states of said random resistant logic circuit during said functional mode of operation; and
    said control-improving logic circuit configured for automatic activation responsive to said input net signals in a testing mode of operation to increase controllability of said random resistant output signals, said activated control-improving logic circuit preserving original functionality of said output signals of said random resistant logic circuit responsive to said input net signals in the functional mode, and yielding new output signals of said combinational logic circuit corresponding to said unreachable states for testing said random resistant logic circuit in said testing mode of operation, said unreachable states being a state of said integrated circuit that can be accessed only during the testing mode of said integrated circuit and is not reachable when said integrated circuit is operating in the functional mode.

12. The system of claim 11, wherein said control-improving logic circuit is active during a testing mode of said integrated circuit and remains inactive when said integrated circuit is in its functional mode.

13. The system of claim 12, wherein said integrated circuit includes existing logic circuitry, said existing logic circuitry generating said input net signals for said automatic activating said control-improving logic circuit.

14. The system of claim 12, wherein said integrated circuit is forced into said testing mode of operation without using a test enable signal.

15. The system of claim 11, wherein said random resistant logic circuit lacks "1"-controllability, said control-improving logic circuit including an OR gate for increasing said "1"-controllability of said random resistant logic circuit.

16. The system of claim 11, wherein said random resistant logic circuit lacks "0"-controllability, said control-improving logic circuit including an AND gate for increasing said "0"-controllability of said random resistant logic circuit.

17. The system of claim 14, wherein said testing mode of operation is automatically activated responsive to receiving said input net signals corresponding to said unreachable states or a subset of said unreachable states at said control-improving logic circuit.

18. The system of claim 14, further comprising:
a weighting function circuit operatively connected to receive plural input net signals corresponding to subsets of unreachable states at each of different circuit paths of said integrated circuit, said weighting function circuit configured to apply a weight to each of said plural input net signals received for each path; and
said control-improving logic circuit automatically activated corresponding to input net signals of a circuit path based on said applied weight.

19. The system of claim 14, wherein said unreachable states are used as "don't care" conditions to change logic of a circuit design, said system further comprising:
a memory,
a hardware processor coupled with said memory and configured to perform a method comprising:
determining from an existing logic circuit design, said unreachable states;
computing "don't care" values in terms of said unreachable states;
propagating said don't care values to a circuit having a local logic gate in a region of said existing logic circuit design having outputs of limited controllability; and
modifying said circuit having said local gate to increase its random testability by one of:
adding don't care values if said local gate exhibits limited 0-controllability, or subtracting don't care values if said local gate exhibits limited 1-controllability.

20. The system of claim 19, wherein said existing logic circuit design includes a combinational logic circuit for generating net signals, said hardware processor further configured to:
subtract from said computed "don't care" values one or more combinational don't care values which are output from combinational logic circuit of the existing design.

* * * * *